(12) United States Patent
Xie et al.

(10) Patent No.: US 8,513,971 B2
(45) Date of Patent: Aug. 20, 2013

(54) ZENER DIODE DETECTING CIRCUIT

(75) Inventors: Ling-Yu Xie, Shenzhen (CN);
Xing-Ping Xie, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 295 days.

(21) Appl. No.: 13/030,362

(22) Filed: Feb. 18, 2011

(65) Prior Publication Data

US 2012/0043990 A1    Feb. 23, 2012

(30) Foreign Application Priority Data

Aug. 19, 2010 (CN) .......................... 2010 1 0257303

(51) Int. Cl.
*G01R 31/02* (2006.01)
*G01R 31/26* (2006.01)

(52) U.S. Cl.
USPC .......................... 324/762.07; 361/90; 438/17

(58) Field of Classification Search
USPC ................. 324/158, 762.07; 361/90; 438/17
See application file for complete search history.

(56) References Cited

U.S. PATENT DOCUMENTS

| | | | | |
|---|---|---|---|---|
| 4,727,318 A | * | 2/1988 | Sakai et al. | 324/762.01 |
| 5,786,689 A | * | 7/1998 | Kimura | 324/762.07 |
| 2004/0160716 A1 | * | 8/2004 | Miura | 361/90 |

OTHER PUBLICATIONS

Keijer, Energy Losses in Transformers, Rectifiers, and Mains Adaptors, www.dicks-wesbite.eu/transformatortest/enindex.html, Apr. 21, 2009, p. 3.*
Berkeley, EE40 Summer 2004: Lab 10, www-inst.eecs.berkeley.edu/~ee40/su04/labs/lab10/lab10.html, Sep. 15, 2006, p. 2.*
Keijer, Energy Losses in Transformers, Rectifiers, and Main Adaptors, www.dicks-website.eu/transformatortest/enindex.html, Apr. 2, 2009, p. 3.*
Berkeley, EE40 Summer Lab 2004: Lab 10, www-inst.eecs.berkeley.edu/~ee40/su04/labs/lab10/lab10.html, Sep. 2006, p. 2.*

* cited by examiner

*Primary Examiner* — Patrick Assouad
*Assistant Examiner* — Sean Curtis
(74) *Attorney, Agent, or Firm* — Altis Law Group, Inc.

(57) ABSTRACT

A circuit includes a power supply circuit and a measuring circuit. The measuring circuit includes a voltage meter, a current meter, and a connector connected to a zener diode under test. The voltage meter is connected to the connector in parallel. The current meter is configured to measure a current flowing through the zener diode. The power supply circuit is capable of providing an output voltage that becomes greater gradually. The voltage meter is capable of obtaining a breakdown voltage of the zener diode when the current flowing through the zener diode increases and a voltage across the zener diode is unchanged.

14 Claims, 2 Drawing Sheets

ZENER DIODE DETECTING CIRCUIT

BACKGROUND

1. Technical Field

The present disclosure relates to a detecting circuit capable of detecting a breakdown voltage of a zener diode.

2. Description of Related Art

A zener diode is a type of diode that permits current not only in the forward direction like a normal diode, but also in the reverse direction if the voltage is larger than the breakdown voltage, known as "Zener knee voltage" or "Zener voltage". Nowadays, more and more types of zener diodes are appearing on the market. Before using the zener diodes in circuits, the breakdown voltage of each of the zener diodes should be measured so the zener diodes can be used correctly.

SUMMARY

A circuit includes a power supply circuit and a measuring circuit. The measuring circuit includes a voltage meter, a current meter, and a connector connected to a zener diode under test. The voltage meter is connected to the connector in parallel. The current meter is configured to measure a current flowing through the zener diode. The power supply circuit is capable of providing an output voltage that becomes greater gradually. The voltage meter is capable of obtaining a breakdown voltage of the zener diode when the current flowing through the zener diode increases and a voltage across the zener diode is unchanged.

The first indicating circuit 30 includes a first light emitting diode (LED) D3 and a resistor R1 connected to the first LED D3 in series. An anode of the first LED D3 is connected to the node V+. A cathode of the first LED D3 is connected to the node V− via the resistor R1.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
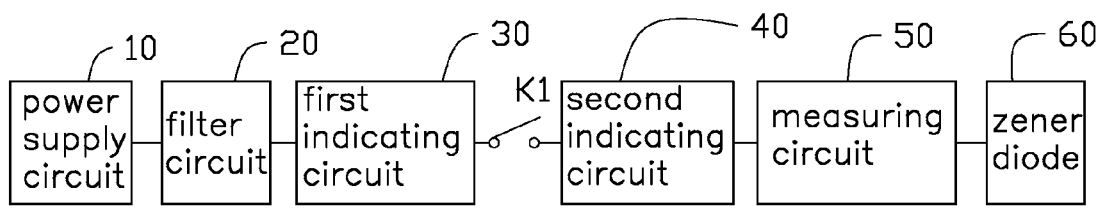
FIG. 1 is a block diagram of a zener diode detecting circuit in accordance with an embodiment.

Referring to FIG. 1, an embodiment of a detecting circuit includes a power supply circuit 10, a filter circuit 20, a first indicating circuit 30, a second indicating circuit 40, and a measuring circuit 50. The measuring circuit 50 is configured to measure a current and a voltage of a zener diode 60. A start switch K1 is connected between the first indicating circuit 30 and the second indicating circuit 40. When the start switch K1 is switched on, the measuring circuit 50 is powered on to detect the zener diode 60.

Figure 2:
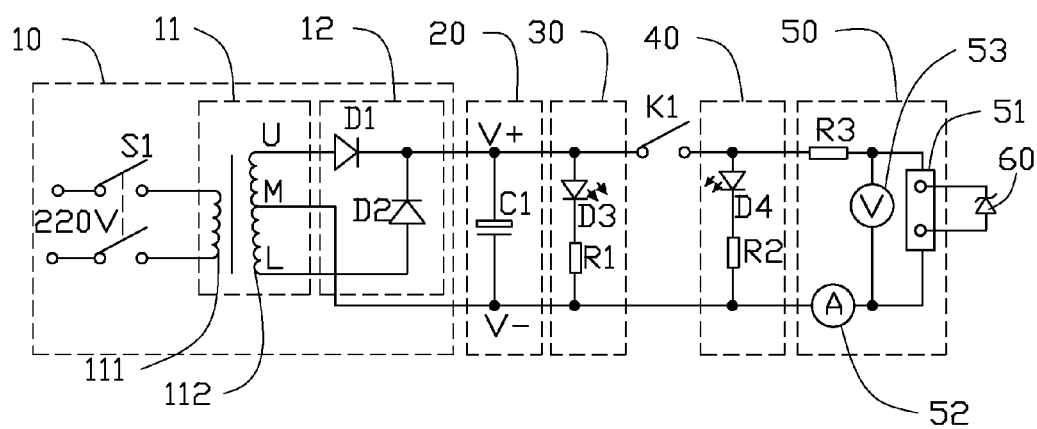
FIG. 2 is a detailed circuit of the zener diode detecting circuit of FIG. 1.

Referring to FIG. 2, the power supply circuit 10 includes a transformer 11 and a bridge rectifier 12. The transformer 11 includes a primary coil 111 and a secondary coil 112. The primary coil 111 is connected to an alterative current (AC) power supply (e.g., 220V) via a double pole single throw switch S1. The secondary coil 112 includes a first terminal U, a second terminal L, and an intermediate terminal M movable between the first terminal U and the second terminal L. The bridge rectifier 12 includes a first diode D1 and a second diode D2. An anode of the first diode D1 is connected to the first terminal U of the transformer 11. A cathode of the first diode D1 is connected to a node V+. An anode of the second diode D2 is connected to the second terminal L of the transformer 11. A cathode of the second diode D2 is connected to the node V+. The intermediate terminal M of the transformer 11 is connected to the node V−. The node V+ is a positive output terminal of the power supply circuit 10, and the node V− is a negative output terminal of the power supply circuit 10.

The filter circuit 20 includes a filter capacitor C1. A positive terminal of the filter capacitor C1 is connected to the node V+. A negative terminal of the filter capacitor C1 is connected to the node V−.

The first indicating circuit 30 includes a first light emitting diode (LED) D3 and a resistor R1 connected to the first LED D3 in serial. An anode of the first LED D3 is connected to the node V+. A cathode of the first LED D3 is connected to the node V− via the resistor R1.

The second indicating circuit 40 includes a second LED D4 and a resistor R2 connected to the second LED D4 in series. An anode of the second LED D4 is connected to the node V+ via the start switch K1. A cathode of the second LED D4 is connected to the node V− via the resistor R2.

The measuring circuit 50 is connected to the second indicating circuit 40 in parallel. The measuring circuit 50 includes a current limiting resistor R3, a connector 51, a current meter 52, and a voltage meter 53. The current limiting resistor R3, the connector 51, and the current meter 52 are connected in series. The voltage meter 53 is connected to the connector 51 in parallel. A positive output port of the connector 51 is connected to a cathode of the zener diode 60. A negative output port of the connector 51 is connected to an anode of the zener diode 60.

To detect the zener diode 60, the switch S1 is closed, the transformer 11 drops down the 220V power supply. The bridge rectifier 12 rectifies the voltage signal output from the transformer 11. Then the power supply circuit 10 outputs a voltage that can drive the first indicating circuit 30 and the second indicating circuit 40. In an embodiment, the intermediate terminal M of the transformer 11 can be moved to various positions for adjusting the output voltage of the power supply circuit 10. The first LED D3 of the first indicating circuit 30 is powered on to indicate that the power supply circuit 10 is powered on. The start switch K1 is switched on after the power supply circuit 10 is powered on. The second LED D4 of the second indicating circuit 40 is powered on to indicate that the measuring circuit 50 is powered on and starts to work. The voltage meter 53 measures a voltage across the zener diode 60. The current meter 52 measures an invert current flowing through the zener diode 60. To obtain a breakdown voltage of the zener diode 60, the intermediate terminal M of the transformer 11 moves from the first terminal U to the second terminal L. Then the output voltage of the power supply circuit 10 increases gradually. When the invert current measured by the current meter 52 increases suddenly and the voltage measured by the voltage meter 53 is unchanged, the breakdown voltage of the zener diode 60 is obtained.

In one embodiment, the first LED D3 is a red LED, and the second LED D4 is a yellow LED to distinguish from the first LED D3. The power supply circuit 10 can be other voltage-adjustable power supplies. In other embodiments, the LEDs D3 and D4 can be the same or different colors.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. A detecting circuit comprising:
    a power supply circuit;
    a connector configured to be connected to a zener diode to be tested;
    a first indicating circuit connected to output terminals of the power supply circuit, wherein the first indicating circuit is configured to indicate whether the power supply circuit is powered on, and the first indicating circuit comprises a first light emitting diode and a first resistor connected to the first light emitting diode in series;
    a second indicating circuit and a start switch, wherein the second indicating circuit is connected to the first indicating circuit via the start switch, and the second indicating circuit comprises a second light emitting diode configured to indicate whether the connector is ready to test the zener diode, and a second resistor connected to the second light emitting diode in series, start switch is connected to the first indicating circuit and the second indicating circuit in series, the second light emitting diode is connected to the connector in parallel;
    a current limiting resistor connected to the power supply circuit and the connector; and
    a voltage meter connected to the connector in parallel;
    wherein the power supply circuit is configured to provide an output voltage that increases gradually, and the voltage meter is capable of obtaining a breakdown voltage of the zener diode when a voltage across the zener diode is unchanged as the output voltage increases.

2. The detecting circuit of claim 1, wherein the power supply circuit comprises a transformer connected to an alternative power supply, and the transformer comprises a primary coil and a secondary coil.

3. The detecting circuit of claim 2, wherein the secondary coil has a first terminal, a second terminal, and an intermediate terminal movable between the first terminal and the second terminal.

4. The detecting circuit of claim 3, wherein the power supply circuit further comprises a bridge rectifier connected to the secondary coil.

5. The detecting circuit of claim 4, wherein the bridge rectifier comprises a first diode and a second diode, an anode of the first diode is connected to the first terminal of the transformer, an anode of the second diode is connected to the second terminal of the transformer, a cathode of each of the first diode and the second diode is connected to a positive output terminal of the power supply circuit, and the intermediate terminal of the transformer is connected to a negative output terminal of the power supply circuit.

6. The detecting circuit of claim 1, further comprising a filter capacitor connected to output terminals of the power supply circuit.

7. The detecting circuit of claim 1, further comprising a current meter connected to the zener diode to measure a current flowing through the zener diode.

8. A detecting circuit comprising:
    a power supply circuit;
    a first indicating circuit connected to output terminals of the power supply circuit, wherein the first indicating circuit is configured to indicate whether the power supply circuit is powered on, and the first indicating circuit comprises a first light emitting diode and a first resistor connected to the first light emitting diode in series;
    a second indicating circuit and a start switch, wherein the second indicating circuit is connected to the first indicating circuit via the start switch, and the second indicating circuit comprises a second light emitting diode and a second resistor connected to the second light emitting diode in series, the start switch is connected to the first indicating circuit and the second indicating circuit in series, the second light emitting diode is connected to the power supply circuit in parallel; and
    a measuring circuit comprising a voltage meter, a current meter, and a connector configured to be connected a zener diode to be tested, the voltage meter connected to the connector in parallel, and the current meter configured to measure an invert current flowing through the zener diode;
    wherein the power supply circuit is configured to provide an output voltage that become greater gradually, and the voltage meter is capable of obtaining a breakdown voltage of the zener diode when the invert current flowing through the zener diode increases and a voltage across the zener diode is unchanged.

9. The detecting circuit of claim 8, wherein the power supply circuit comprises a transformer connected to an alternative power supply, and the transformer comprises a primary coil and a secondary coil.

10. The detecting circuit of claim 9, wherein the secondary coil has a first terminal, a second terminal, and an intermediate terminal movable between the first terminal and the second terminal.

11. The detecting circuit of claim 10, wherein the power supply circuit further comprises a bridge rectifier connected to the secondary coil.

12. The detecting circuit of claim 11, wherein the bridge rectifier comprises a first diode and a second diode, an anode of the first diode is connected to the first terminal of the transformer, an anode of the second diode is connected to the second terminal of the transformer, a cathode of each of the first diode and the second diode is connected to a positive output terminal of the power supply circuit, and the intermediate terminal of the transformer is connected to a negative output terminal of the power supply circuit.

13. The detecting circuit of claim 8, further comprising a filter capacitor connected to output terminals of the power supply circuit.

14. The detecting circuit of claim 8, further comprising a current limiting resistor connected to the power supply circuit and the connector.

* * * * *